United States Patent [19]
Fujita

[11] Patent Number: 5,943,271
[45] Date of Patent: Aug. 24, 1999

[54] SEMICONDUCTOR INTEGRATED CIRCUIT DEVICE

[75] Inventor: Tetsuya Fujita, Kawasaki, Japan

[73] Assignee: Kabushiki Kaisha Toshiba, Tokyo, Japan

[21] Appl. No.: 09/103,134

[22] Filed: Jun. 23, 1998

[30] Foreign Application Priority Data

Jun. 24, 1997 [JP] Japan ................................. 9-167198

[51] Int. Cl.⁶ .................................................. G11C 16/04
[52] U.S. Cl. ..................... 365/189.09; 365/226; 365/534; 365/536
[58] Field of Search .............................. 365/226, 189.09; 327/534, 536

[56] References Cited

U.S. PATENT DOCUMENTS

| 5,315,166 | 5/1994 | Arimoto | 327/534 |
| 5,408,140 | 4/1995 | Kawai et al. | 327/534 |
| 5,524,266 | 6/1996 | Tedrow et al. | 365/189.09 |
| 5,604,707 | 2/1997 | Kuge et al. | 365/189.09 |
| 5,644,534 | 7/1997 | Soejima | 365/189.09 |
| 5,715,199 | 2/1998 | Kim | 365/189.09 |
| 5,874,851 | 2/1999 | Shiota | 365/189.09 |

Primary Examiner—Son T. Dinh
Attorney, Agent, or Firm—Loeb & Loeb LLP

[57] ABSTRACT

A semiconductor integrated circuit device permitting the chip area to be as small as possible without lowering the maximum arrival voltage is provided. This semiconductor integrated circuit device includes first to n-th charge pump circuits respectively driven on the basis of clocks CLK1, CLK2 to bias semiconductor substrate or well formed at the semiconductor substrate, wherein the i-th (i=1, . . . n−1) charge pump circuit is caused to be of a structure in which the current drivability is large, but the maximum arrival voltage is low as compared to the (i+1)-th charge pump circuit.

13 Claims, 13 Drawing Sheets

SEMICONDUCTOR INTEGRATED CIRCUIT DEVICE

FIELD OF THE INVENTION

This invention relates to a semiconductor integrated circuit device provided with a charge pump circuit for substrate bias.

BACKGROUND OF THE INVENTION

Generally, current drivability required in biasing semiconductor substrate (or well formed at semiconductor substrate) by charge pump circuit for substrate bias must be equal to value in which margin is added to substrate current. It is considered that the main cause of the substrate current is due to collision ionization taking place as the result of the fact that electrons flowing between the source and the drain of MOS transistor are accelerated by high electric field. Moreover, reverse bias leakage current of PN junction within the device is added in addition to the above. Empirically, as seen from the actual measurement result shown in FIGS. 6 and 7, with respect to substrate current $I_{sub}$, the following equations (1), (2) hold between the source-drain voltage $V_{DS}$ and the drain current.

$$\ln I_{sub} \alpha - 1/V_{DS} \qquad (1)$$

$$I_{sub} \alpha I_D \qquad (2)$$

When the substrate bias is caused to be large by the charge pump circuit for substrate bias, the substrate current is also decreased in accordance with to what degree the drain current is decreased by the back-gate effect. Accordingly, as the current drivability of the charge pump circuit, it is required for the current drivability of the charge pump circuit that this charge pump circuit can be driven by the maximum substrate current when the substrate bias at the time of start of driving is zero V.

A charge pump circuit used for biasing the P-type substrate or the P-well is shown in FIG. 8. This charge pump circuit includes four P-channel MOS transistors $M_0$, $M_1$, $M_2$, $M_3$ connected in series, and capacitors $C_1$, $C_2$, $C_3$, and is driven by two clocks CLK1, CLK2 which are the same in frequency, but are shifted in phase.

Gates of respective transistors $M_0$, $M_1$, $M_2$, $M_3$ are respectively connected to their own drains. Drain of transistor $M_0$ is connected to ground power supply terminal GND, and source of transistor $M_3$ is connected to P-type substrate or P-well. In addition, for each positive integer i from 1 to 3, one end of capacitor $C_i$ is connected to gate of the transistor $M_i$.

Further, clock CLK1 is applied to the other ends of the capacitors $C_1$, $C_3$, and clock CLK2 is applied to the other end of capacitor $C_2$.

The operation of this charge pump circuit will now be described. When positive pulse is applied to the capacitors $C_1$, $C_3$ as clock CLK1, potentials of node $N_1$ (gate and drain of transistor $M_1$) and of node $N_3$ (gate and drain of transistor $M_3$) rise in response to rising of this pulse. As a result, gate-source voltages $V_{GS}$ of transistors $M_0$, $M_2$ are above the threshold voltage $V_{th}$ so that they are turned ON. Thus, electrical charges stored in the capacitors $C_1$, $C_3$ are transferred to ground power supply GND and capacitor $C_2$ through the transistors $M_0$, $M_2$. By this transfer of electrical charges, potentials on the nodes $N_1$, $N_3$ shortly return to original potential. As a result, gate-source voltages $V_{GS}$ of transistors $M_0$, $M_2$ are below the threshold voltage so that they are turned OFF.

Moreover, when the pulse falls down, potentials of the nodes $N_1$, $N_3$ are lowered. As a result, gate-source voltages $V_{GS}$ of the transistors $M_1$, $M_3$ are above the threshold voltage $V_{th}$ so that they are turned ON. Thus, electrical charges stored in the capacitor $C_2$ and the substrate (or well) are transferred to the capacitors $C_1$, $C_3$ through the transistors $M_1$, $M_3$. By transfer of these electrical charges, potentials of the nodes $N_1$, $N_3$ shortly return to original potential. Thus, gate-source voltages $V_{GS}$ of the transistors $M_1$, $M_3$ are below the threshold voltage $V_{th}$ so that they are turned OFF.

When positive pulse is applied to the capacitor $C_2$ as clock CLK2, potential of the node $N_2$ rises in response to rising of this pulse. As a result, gate-source voltage $V_{GS}$ of the transistor $M_1$ is above the threshold voltage $V_{th}$ so that it is turned ON. Thus, electrical charges stored in the capacitor $C_2$ are transferred to the capacitor $C_1$ through the transistor $M_1$. By transfer of these electrical charges, potential of the node $N_2$ shortly returns to original potential. Thus, the gate-source voltage $V_{GS}$ of the transistor $M_1$ is below the threshold voltage $V_{th}$ so that it is turned OFF.

By repeating an operation as described above, electrical charges of the P-type substrate (or P-well) are carried in a manner of bucket relay through the capacitors $C_1$, $C_2$, $C_3$ and are sent into ground power supply GND. Thus, potential of the P-type substrate (or P well) gradually falls.

The current drivability $I_{pump}$ of such charge pump is represented by the following equation.

$$I_{pump} = f_{CLK} \cdot C \cdot (V_{CLK} - V_{th}) \qquad (3)$$

In the above-mentioned equation, $f_{CLK}$ is frequency of clocks CLK1, CLK2, C is capacitance of the capacitors C1, C2, C3, $V_{CLK}$ is clock amplitude, and $V_{th}$ is threshold voltage of MOS transistor.

Moreover, when n is the number of stages of transistors connected in series, the maximum arrival voltage $V_{pump}$ that the substrate bias $V_{SUB}$ can arrive by this charge pump is represented by the following equation.

$$V_{pump} = (n-1) \cdot V_{CLK} - n \cdot V_{th} \qquad (4)$$

The substrate on which the MOS transistors $M_0$, $M_1$, $M_2$, $M_3$ constituting the above-described charge pump circuit are formed is connected to the terminal of power supply voltage $V_{DD}$ (=3.3 V), and source potential of the transistor $M_0$ is $0V + V_{th}$. Accordingly, there results the state where back-gate voltage of $(3.3V - V_{th})$ is applied.

Moreover, with respect to source potentials of the transistors $M_1$, $M_2$, $M_3$, according as potential of the substrate (or well) is lowered to more degree by action of the charge pump circuit, back-gate voltage is applied to more degree. For this reason, the threshold voltage becomes large for back-gate effect.

The simulation result of the current drivability characteristic with respect to output voltage of the above-described charge pump circuit is shown in FIG. 9. The maximum arrivable voltage of the substrate bias is determined by the number of stages of transistors connected in series as seen from the equation (4), and the current drivability is substantially constant until output voltage becomes close to the maximum arrival voltage as seen from the simulation result of FIG. 9.

Accordingly, in the conventional semiconductor integrated circuit device having such charge pump circuit, in the case where the number of stages of transistors connected in series is increased for the purpose of increasing the maximum arrival voltage, it is required to prepare capacitors $C_1$, $C_2$, $C_3$ of large capacity, etc. caused to be in correspondence with the maximum substrate current when the substrate bias at the time of starting of drive which is required as the current drivability of the charge pump circuit is zero V by the number corresponding to the number of the capacitors $C_1$, $C_2$, $C_3$, etc. This means increased chip area.

In addition, the power supply voltage has a tendency to be lowered in future. Since the clock amplitude $V_{CLK}$ also becomes small followed by this, it is required to increase the number n of stages of transistors connected in series in order to allow the arrival voltage shown in the equation (4) to be unchanged. This results in increased number of capacitors, giving rise to the problem of increase in the device area, i.e., increase in the chip area.

SUMMARY OF THE INVENTION

This invention has been made in consideration of circumstances as described above, and its object is to provide a semiconductor integrated circuit device capable of allowing the chip area to be as small as possible without lowering the maximum arrival voltage.

A first aspect of a semiconductor integrated circuit device according to this invention includes first to n-th charge pump circuits respectively driven on the basis of clock and adapted for biasing a semiconductor substrate or a well formed at the semiconductor substrate, wherein for each positive integer i from 1 to n−1, the i-th charge pump circuit has a structure in which the current drivability is large, but the maximum arrival voltage is low as compared to the (i+1)-th charge pump circuit.

Moreover, a second aspect of a semiconductor integrated circuit device according to this invention is characterized in that, in the semiconductor integrated circuit of the first aspect, with respect to each i-th (i=1, ... n) charge pump circuit, there are provided a substrate bias detection circuit for detecting substrate bias of the semiconductor substrate or the well to output a control signal when this detection value reaches the maximum arrival voltage of the i-th charge pump circuit, and pump control means for stopping supply of each of the clock to the i-th charge pump circuit on the bias of the control signal.

Further, a third aspect of a semiconductor integrated circuit device according to this invention is characterized in that, in the semiconductor integrated circuit device of the first or second aspect, each i-th (i=1, ... n) charge pump circuit comprises a series circuit comprised of plural P-channel MOS transistors connected in series each having gate and drain connected to each other, and plural capacitors provided with respect to respective ones of plural MOS transistors of the series circuit except for the MOS transistor of the end of the series circuit having drain connected to a first power supply, and having respective one ends connected to gates of the respective MOS transistors, and respective other ends to which the clock is applied, wherein the number of stages of the MOS transistors connected in series of the i-th (i=2, ... n) charge pump circuit is larger than the number of stages of the MOS transistors connected in series of the (i−1)-th charge pump circuit, and capacities of the respective capacitors of the i-th charge pump circuit are smaller than capacities of the respective capacitors of the (i−1)-th charge pump circuit.

Moreover, a fourth aspect of a semiconductor integrated circuit device according to this invention is characterized in that, in the semiconductor integrated circuit device of the first or second aspect, each i-th (i=1, ... n) charge pump circuit comprises a series circuit composed of plural N-channel MOS transistors connected in series each having gate and drain connected to each other, and plural capacitors provided with respect to respective ones of plural MOS transistors of the series circuit except for the MOS transistor of the end of the series circuit having drain connected to a first power supply, and having respective one ends connected to gates of the respective MOS transistors and respective the other ends to which the clock is applied, wherein the number of stages of the MOS transistors connected in series of the i-th (i=2, ... n) charge pump circuits is larger than the number of stages of the MOS transistors connected in series of the (i−1)-th charge pump circuit, and capacities of the respective capacitors of the i-th charge pump circuit are smaller than capacities of the respective capacitors of the (i−1)-th charge pump circuit.

Further, the clock is two-phase clock signals which are the same in frequency, but are different in phase.

Further, each i-th charge pump circuit has a configuration in which i number of charge pump elements driven by four-phase clock pulses are connected in series.

In addition, four-phase clock pulses consist of first to fourth clock pulses, wherein ON time period of the second clock pulse is included in ON time period of the first clock pulse, ON time period of the third clock pulse is included in ON time period of the second clock pulse, and ON time period of the fourth clock pulse is included in ON time period of the third clock pulse.

DESCRIPTION OF THE PREFERRED EMBODIMENTS

Figure 1:
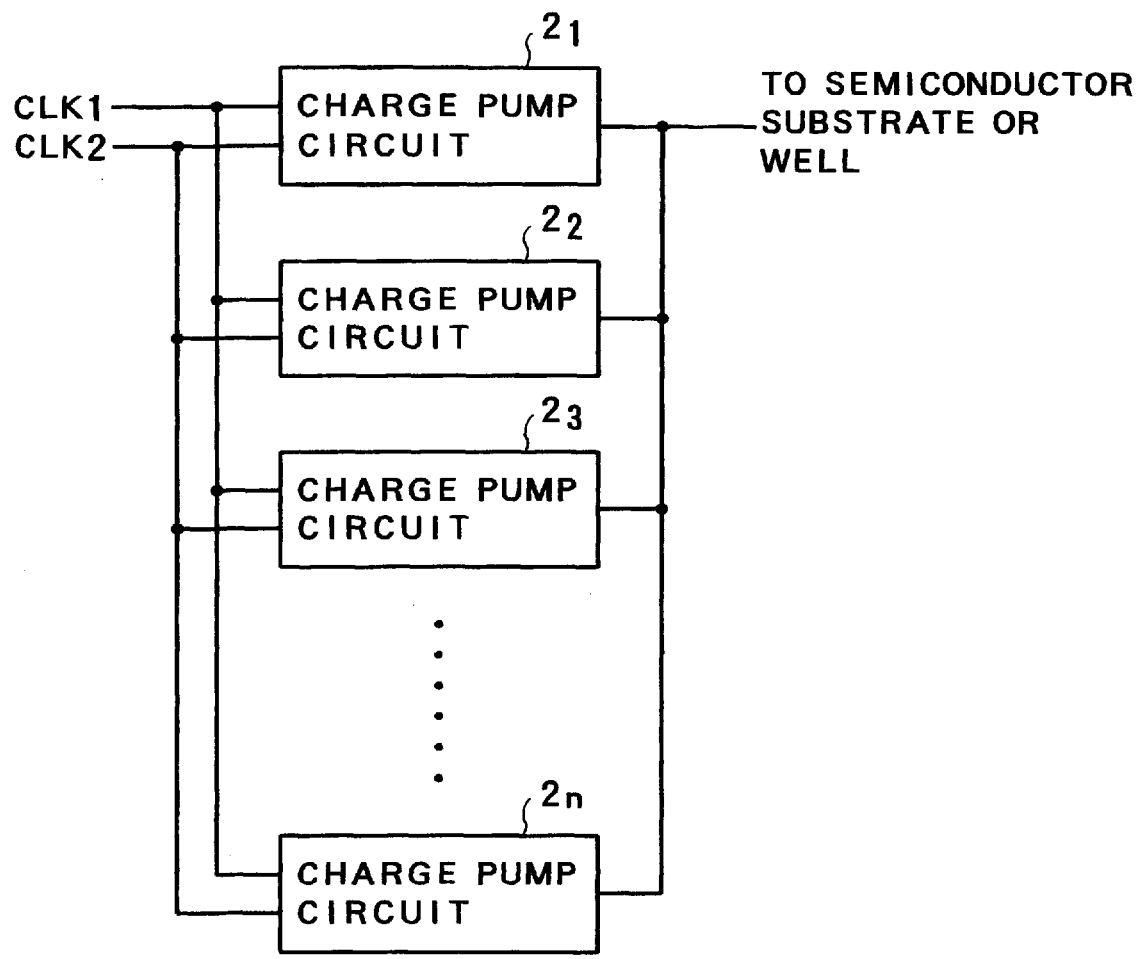
FIG. 1 is a block diagram showing the configuration of a first embodiment of this invention.

The configuration of a first embodiment of a semiconductor integrated circuit device according to this invention is shown in FIG. 1. The semiconductor integrated circuit device of this embodiment includes n number of charge pump circuits $2_1, \ldots 2_n$ connected in parallel. Respective charge pump circuits $2_1, \ldots 2_n$ are driven by two-phase clocks CLK1, CLK2 to pump out electrical charges from the semiconductor substrate (or well) to vary the substrate bias.

Moreover, for each positive integer i from 1 to n−1, the charge pump circuit $2_i$ (i=1, . . . n−1) includes plural MOS transistors connected in series, and has a structure in which the current drivability is larger than that of the charge pump circuit $2_{i+1}$, but the maximum arrival voltage is lower than that.

Figure 8:
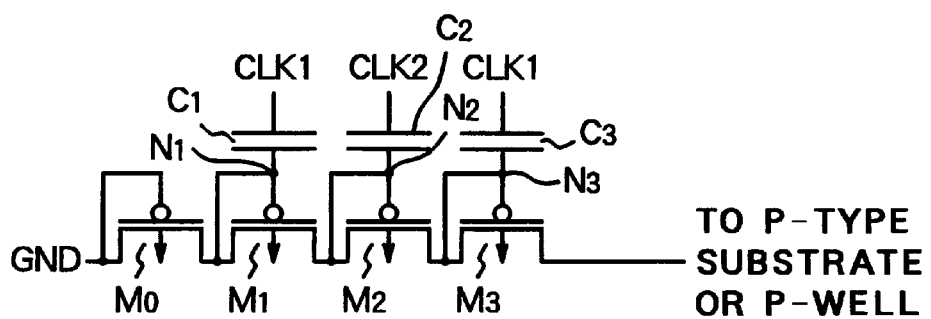
FIG. 8 is a circuit diagram showing the configuration of a conventional charge pump circuit.
Figure 6:
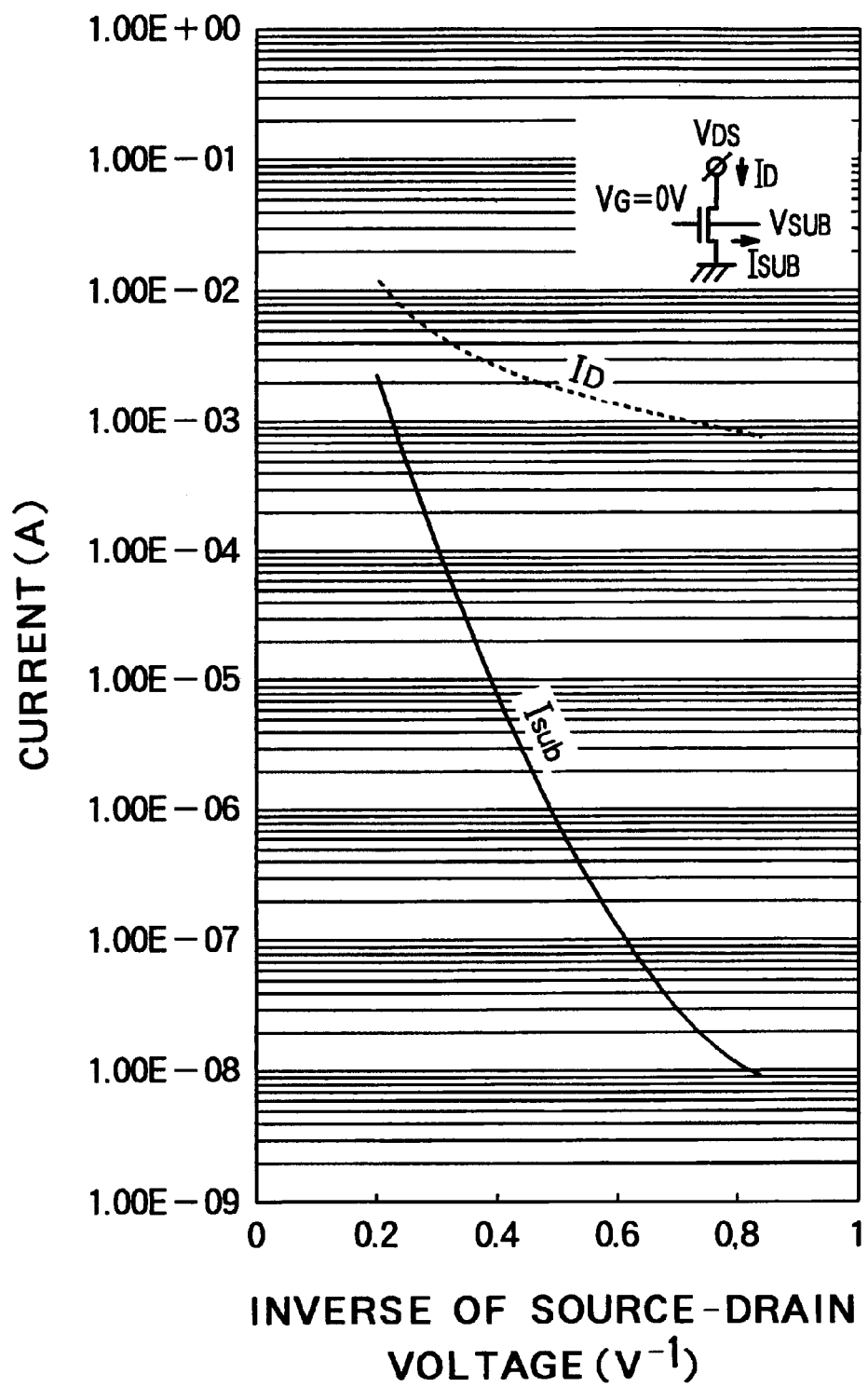
FIG. 6 is a graph showing the relationship between source-drain voltage of the MOS transistor and substrate current.
Figure 7:
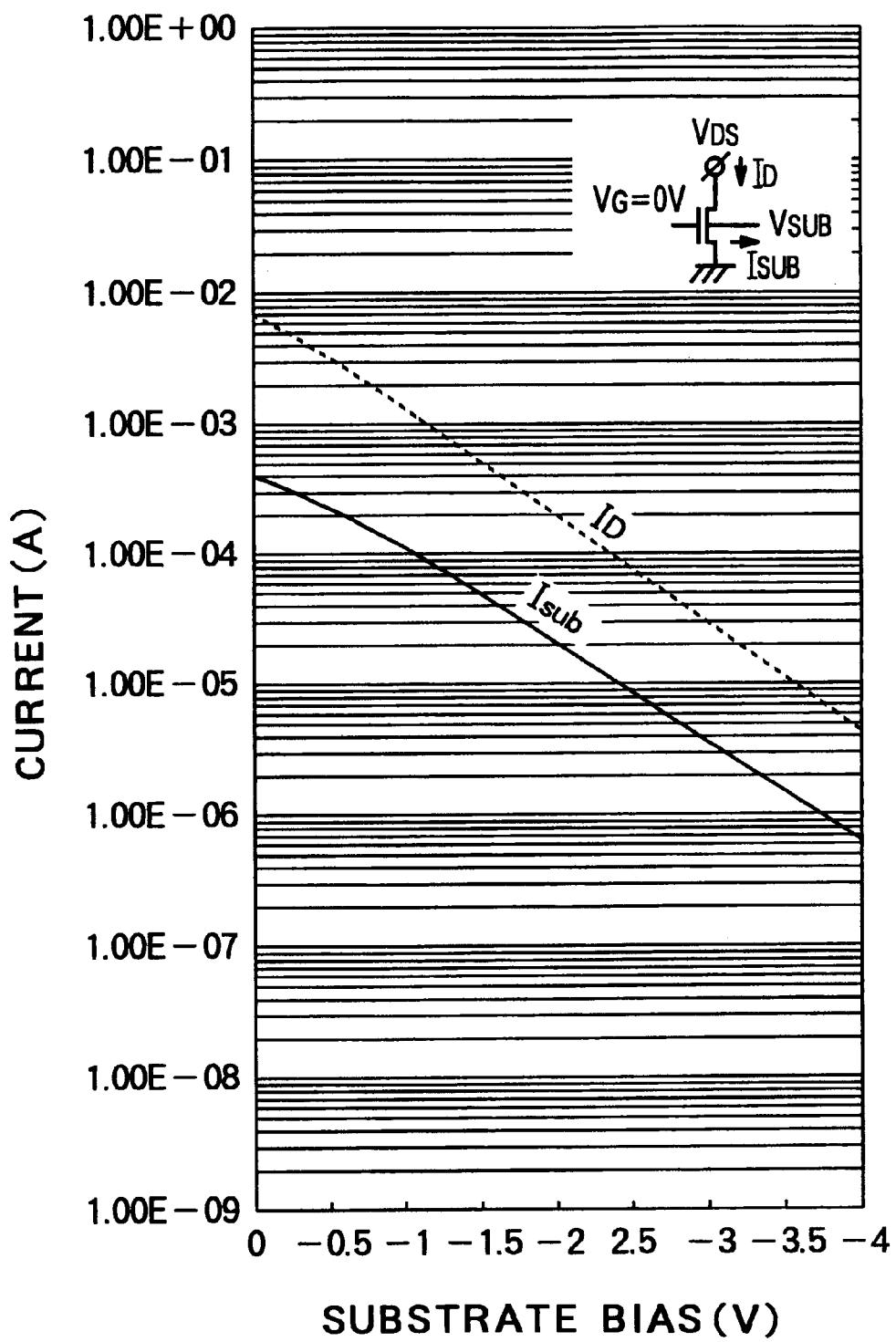
FIG. 7 is a graph showing the relationship between substrate bias and drain current & substrate current.
Figure 9:
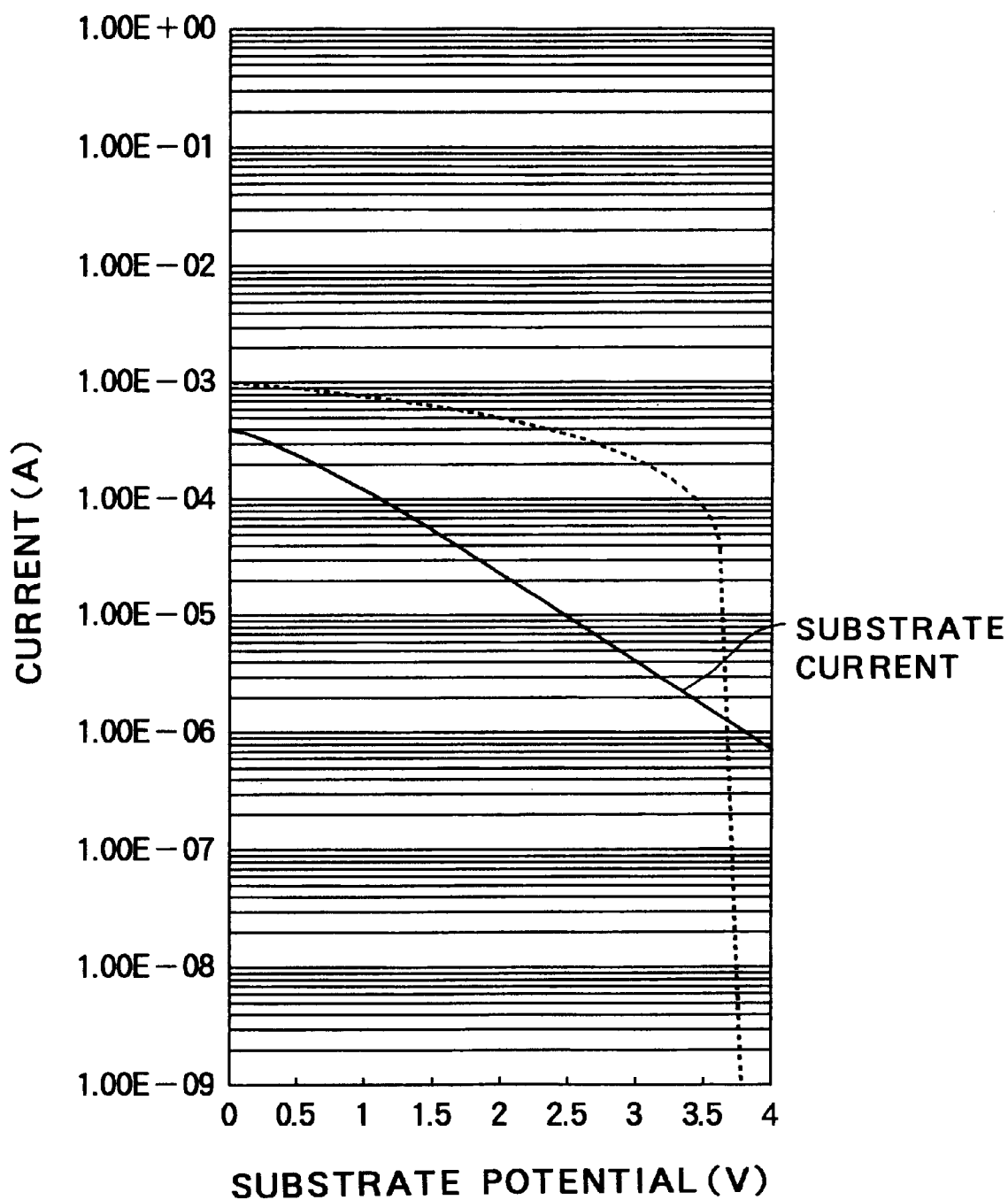
FIG. 9 is a graph showing the characteristic of a conventional charge pump circuit.

The operation of the semiconductor integrated circuit device of the first embodiment will now be described with reference to FIG. 2 in connection with the case where the number n of charge pump circuits $2_1, \ldots 2_n$ is 3. The graphs $g_1, g_2, g_3$ shown in FIG. 2 respectively show simulation results of current drivabilities of the charge pump circuits $2_1, 2_2, 2_3$, and graph $g_4$ shows the simulation result of the current drivability of the conventional charge pump circuit shown in FIG. 8.

Figure 2:
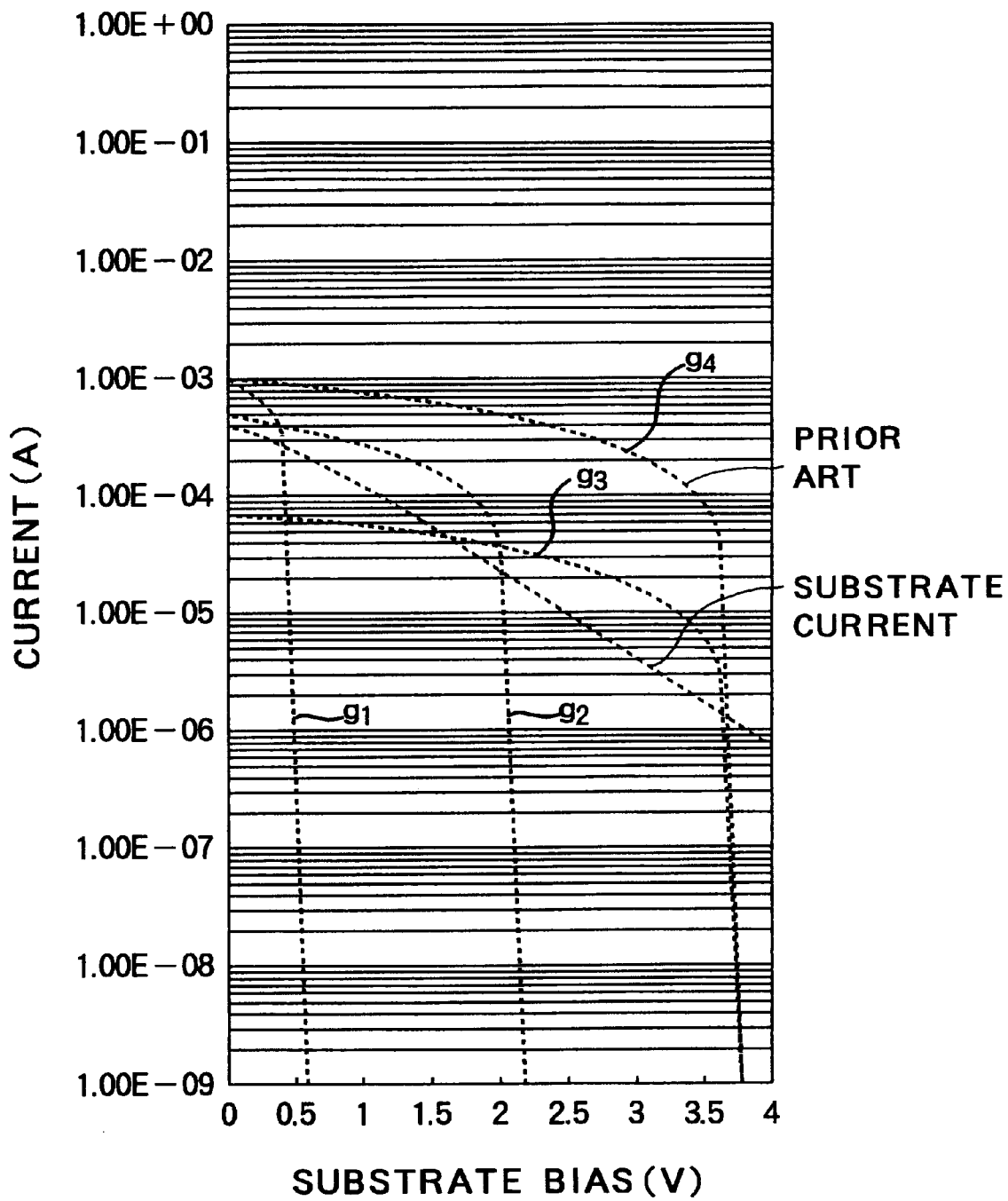
FIG. 2 is a graph for explaining action of the first embodiment.

As seen from this FIG. 2, within the range where the substrate bias is small and the substrate current is large (e.g., substrate bias is 0.6 V or less), the charge pump circuits $2_1, 2_2, 2_3$ are used to carry out current drive; within the range where according as the substrate bias becomes greater, the substrate current becomes lesser (e.g., the substrate bias is 0.6 to 2.2 V), the charge pump circuits $2_2, 2_3$ are used to carry out current drive; and within the range where the substrate bias is large (e.g., 2.2 V or more), only charge pump circuit $2_3$ is used to carry out current drive.

In the semiconductor integrated circuit device of such a configuration, the charge pump circuit $2_1$ having large current drivability but low maximum arrival voltage requires capacitor of large capacity, but it is sufficient to have small number of stages of MOS transistors connected in series. Moreover, the charge pump circuits $2_2, 2_3$ having high maximum arrival voltage and small current drivability have large number of stages of MOS transistors connected in series, but it is sufficient that capacity of the capacitor connected to the gate of the MOS transistor is small by 1~2 digits.

On the contrary, the charge pump circuit of the conventional semiconductor integrated circuit device has the same configuration as the charge pump circuit in which the number of stages of MOS transistors connected in series of the charge pump circuit $2_1$ of this embodiment is increased in order to obtain the same maximum arrival voltage (see graph $g_4$ of FIG. 2) and sum total of capacities of capacitors can be increased as compared to this embodiment.

Accordingly, the semiconductor integrated circuit device of this embodiment can reduce sum total of capacities of capacitors as compared to the conventional case in which the maximum arrival voltage is the same. Thus, the chip area can be reduced.

Figure 3:
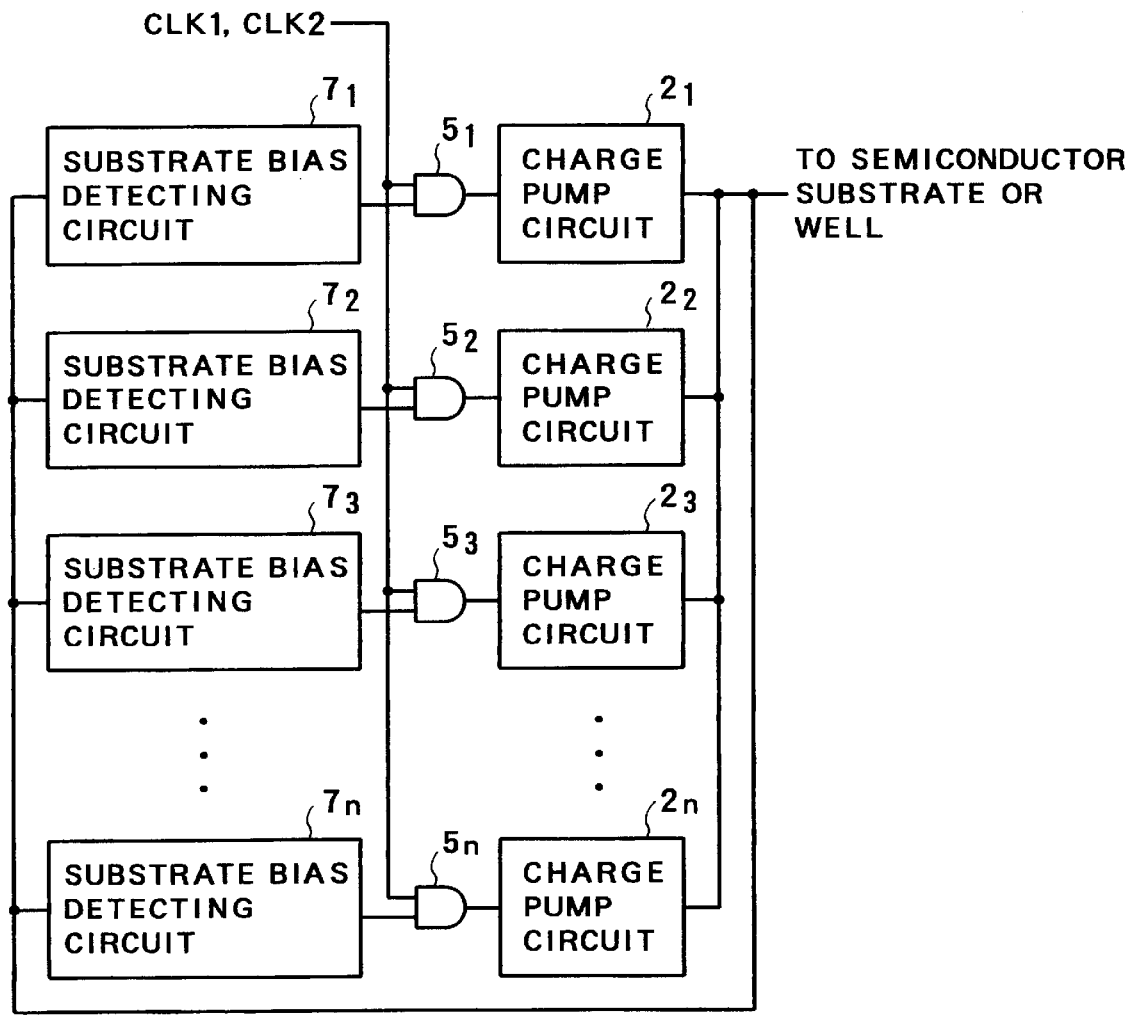
FIG. 3 is a block diagram showing the configuration of a second embodiment of this invention.

The configuration of a second embodiment of the semiconductor integrated circuit device according to this invention is shown in FIG. 3. The semiconductor integrated circuit device of this embodiment is characterized in that, in the semiconductor integrated circuit device of the first embodiment shown in FIG. 1, for each positive integer i from 1 to n, substrate bias detecting circuit $7_i$ and control gate $5_i$ are provided with respect to charge pump circuit $2_i$.

For each positive integer i from 1 to n the substrate bias detecting circuit $7_i$ detects substrate bias (substrate potential) of the semiconductor substrate (or well formed on the semiconductor substrate), whereby in the case where this detection value is above set value, it outputs control signal (e.g., control signal of L level) for stopping drive operations of the charge pump circuit $2_i$.

In this case, the set value of the substrate bias detecting circuit $7_i$ is set to maximum arrival voltages of corresponding charge pump circuit $2_i$.

In the ordinary state of each control gate $5_i$, received clocks CLK1, CLK2 are sent to the corresponding charge pump circuit $2_i$, whereby in the case where the corresponding substrate bias detecting circuit $7_i$ outputs the control signals for stopping drive operation of the charge pump circuit $2_i$, they do not send out the clocks CLK1, CLK2 to the charge pump circuit $2_i$.

Accordingly, in the semiconductor integrated circuit device of the second embodiment, since drive operations of the charge pump circuits which have arrived at respective maximum arrival voltages are stopped, power consumption can be reduced to more degree as compared to the first embodiment in which there has been operated the charge pump which has arrived at the arrival voltage so that the current drivability is lost.

In this case, as compared to the conventional case, this second embodiment can also reduce the chip area similarly to the first embodiment.

Figure 4:
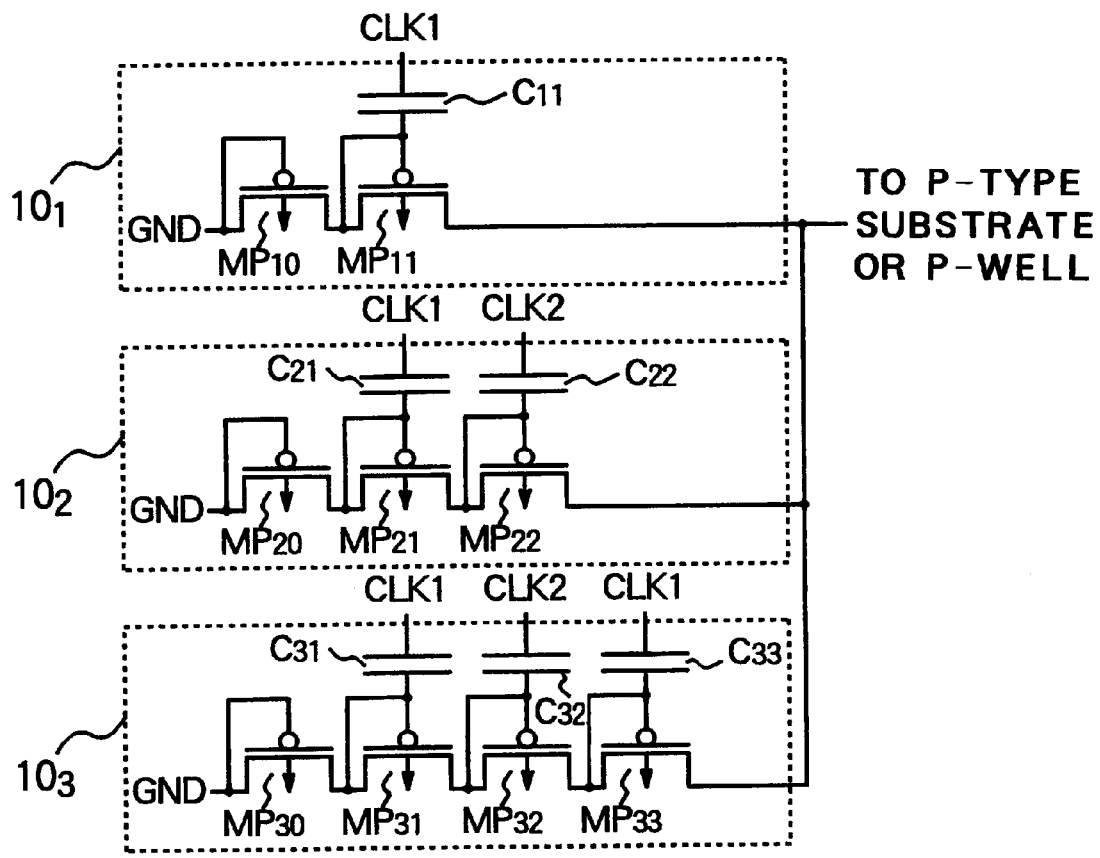
FIG. 4 is a circuit diagram showing the configuration of a third embodiment of this invention.

The configuration of a third embodiment of the semiconductor integrated circuit device according to this invention is shown in FIG. 4. The semiconductor integrated circuit device of this embodiment comprises charge pump circuits $10_1, 10_2, 10_3$. Respective charge pump circuits $10_1, 10_2, 10_3$ are used for biasing the P-type substrate or the P-well.

The charge pump circuit $10_1$ comprises two P-channel MOS transistors $MP_{10}, MP_{11}$ connected in series, and a capacitor $C_{11}$. Respective transistors $MP_{10}, MP_{11}$ are adapted so that gates and drains are respectively connected. Drain of the transistor $MP_{10}$ is connected to ground power supply GND, and source of the transistor $MP_{11}$ is connected to P-type substrate (or P-well). In addition, one end of the capacitor $C_{11}$ is connected to the gate of the transistor $M_{11}$, and clock CLK1 is applied to the other end of this capacitor.

The charge pump circuit $10_2$ includes three P-channel MOS transistors $MP_{20}, MP_{21}, MP_{22}$ connected in series, and capacitors $C_{21}, C_{22}$. Respective transistors $MP_{20}, MP_{21}, MP_{22}$ 2) are adapted so that gates and drains are respectively connected. Drain of the transistor $MP_{20}$ is connected to ground power supply GND, and source of the transistor $MP_{22}$ is connected to the P-type substrate (or P-well). Moreover, respective one ends of the capacitors $C_{2i}$ are connected to the gates of respective transistors $MP21, MP_{22}$. Clock CLK1 is applied to the other end of the capacitor $C_{21}$, and clock CLK2 having phase different from the clock CLK1 is applied to the other end of the capacitor $C_{22}$.

Moreover, the charge pump circuit $10_3$ includes four P-channel MOS transistors $MP_{30}, MP_{31}, MP_{32}, MP_{33}$ connected in series, and capacitors $C_{31}, C_{32}, C_{33}$. Respective transistors $MP_{30}, MP_{31}, MP_{32}, MP_{33}$ are adapted so that gates and drains are respectively connected. Drain of the transistor $MP_{30}$ is connected to ground power supply GND, and source of the transistor $MP_{33}$ is connected to the P-type substrate (or P-well). Further, for each positive integer i from 1 to 3 one end of the capacitor $C_{3i}$ is connected to gate of transistor $MP_{3i}$. In addition, clock CLK1 is applied to the other ends of the capacitors $C_{31}, C_{33}$, and clock CLK2 is applied to the other end of the capacitor $C_{32}$.

In this embodiment, there is employed a configuration such that capacities of the capacitor $C_{21}$ and the capacitor $C_{22}$ are the same, but are smaller than the capacity of the capacitor $C_{11}$. In addition, there is employed a configuration in which capacities of respective capacitors $C_{31}$, $C_{32}$, $C_{33}$ are the same but are smaller than capacity of the capacitor $C_{21}$.

In this example, sizes of the transistor $MP_{10}$ and the transistor $MP_{11}$ are the same. Moreover, there is employed a configuration in which sizes of respective transistors $MP_{20}$, $MP_{21}$, $MP_{22}$ are the same, but are smaller than the size of the transistor $MP_{10}$. In addition, there is employed a configuration in which sizes of respective transistors $MP_{30}$, $MP_{31}$, $MP_{32}$, $MP_{33}$ are the same, but are smaller than size of the transistor $MP_{20}$.

In the semiconductor integrated circuit device of this embodiment constituted in this way, current drivability of the charge pump circuit $10_1$ is larger than the charge pump circuit $10_2$, but the maximum arrival voltage of the former is smaller than the latter. In addition, current drivability of the charge pump circuit $10_2$ is larger than that of the charge pump circuit $10_3$, but the maximum arrival voltage of the former is smaller than that of the latter.

Thus, the semiconductor integrated circuit device of the third embodiment is caused to be of the same structure as the device in which the number n of charge pump circuits is set to 3 in the semiconductor integrated circuit device of the first embodiment.

Figure 5:
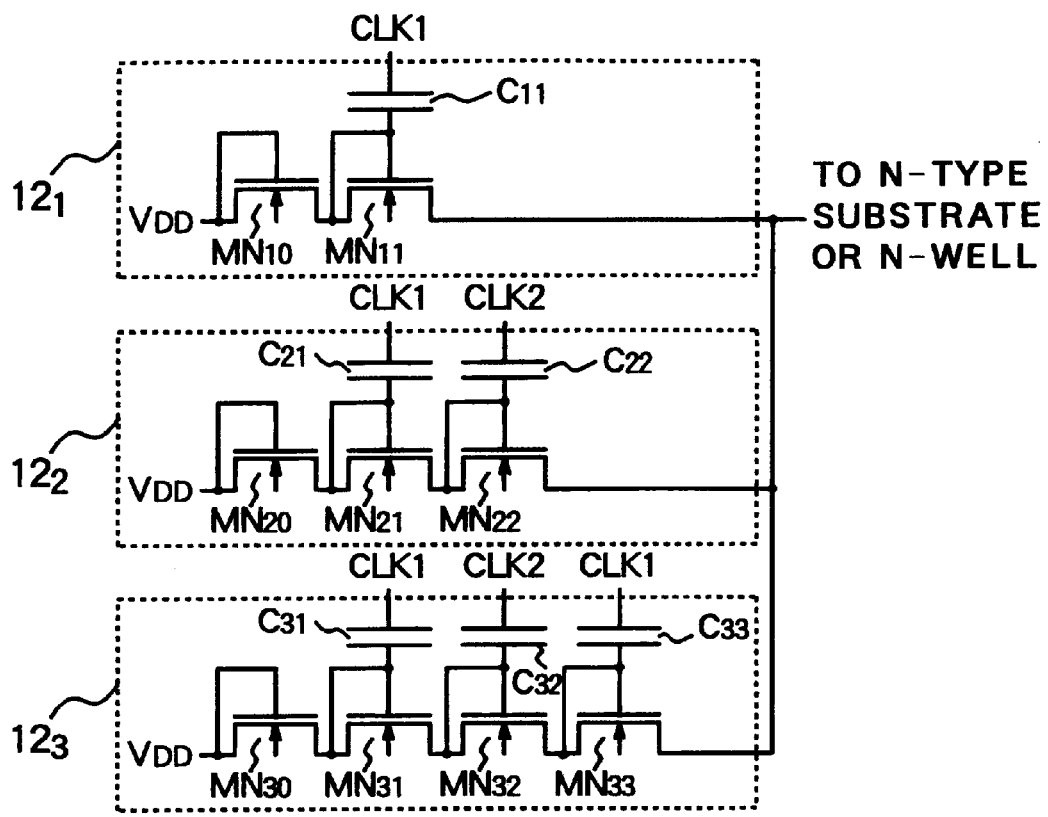
FIG. 5 is a circuit diagram showing the configuration of a fourth embodiment of this invention.

The configuration of a fourth embodiment of the semiconductor integrated circuit device according to this invention is shown in FIG. 5. The semiconductor integrated circuit device of this embodiment has a structure in which, in the semiconductor integrated circuit device of the third embodiment shown in FIG. 4, charge pump circuits $10_1$, $10_2$, $10_3$ are replaced by charge pump circuits $12_1$, $12_2$, $12_3$ respectively.

The charge pump circuit $12_1$ is of a structure in which, in the charge pump circuit $10_1$, P-channel MOS transistors $MP_{10}$, $MP_{11}$ are respectively replaced by N-channel MOS transistors $MN_{10}$, $MN_{11}$. Moreover, the charge pump circuit $12_2$ has a structure in which, in the charge pump circuit $10_2$, P-channel MOS transistors $MP_{20}$, $MP_{21}$, $MP_{22}$ are respectively replaced by N-channel MOS transistors $MN_{20}$, $MN_{21}$, $MN_{22}$. Similarly, the charge pump circuit $12_3$ has a structure in which, in the charge pump circuit $10_3$, P-channel MOS transistors $MP_{30}$, $MP_{31}$, $MP_{32}$, $MP_{33}$ are respectively replaced by N-channel MOS transistors $MN_{30}$, $MN_{31}$, $MN_{32}$, $MN_{33}$.

In this embodiment, drains of the transistors $MN_{10}$, $MN_{20}$, $MN_{30}$ are connected to drive power supply $V_{DD}$, and sources of the transistors $MN_{11}$, $MN_{22}$, $MN_{33}$ are connected to the N-type substrate (or N-well).

It is a matter of course that the semiconductor integrated circuit device of the fourth embodiment can also provide advantages similar to the third embodiment.

It is to be noted that it is a matter of course to employ the charge pump circuit of the third or fourth embodiment as the charge pump circuit of the second embodiment.

In the first to fourth embodiments which have been explained, while the charge pump circuit is driven by two-phase clocks CLK1, CLK2, charge pump circuit driven by four-phase clocks may be used. A semiconductor integrated circuit device having a charge pump circuit driven by 4-phase clocks will be described below.

Figure 10:
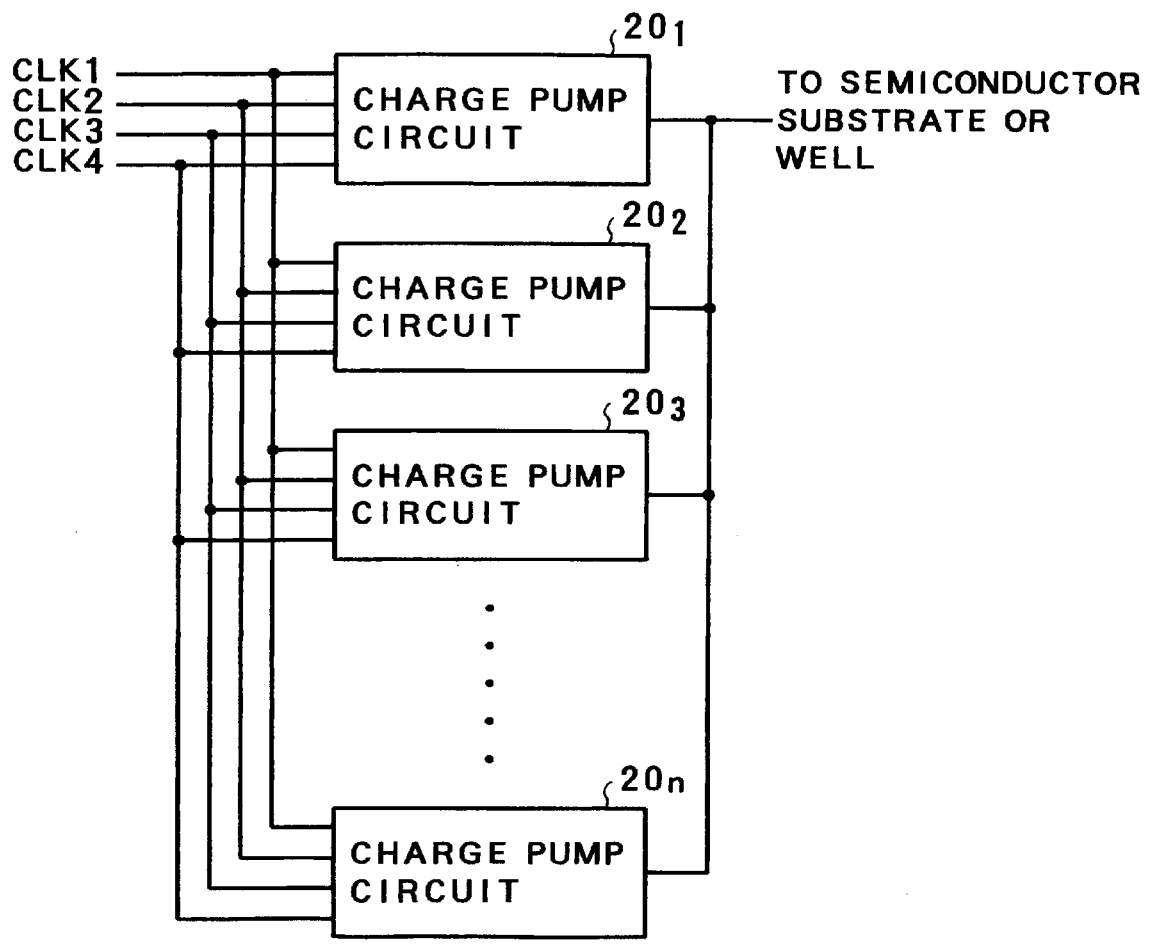
FIG. 10 is a block diagram showing the configuration of a fifth embodiment of this invention.

The configuration of a fifth embodiment of the semiconductor integrated circuit device according to this invention is shown in FIG. 10. The semiconductor integrated circuit device of this embodiment includes n number of charge pump circuits $20_1, \ldots 20_n$ connected in parallel. Respective charge pump circuits $20_1 \ldots 20_n$ on are driven by four-phase clocks CLK1, CLK2, CLK3, CLK4 to pump out electrical charges from the semiconductor substrate or the well to vary the substrate bias.

The charge pump circuit $20_i$ (i=1, ... n) has a configuration in which i number of the same charge pump elements are connected in series.

Figure 11:
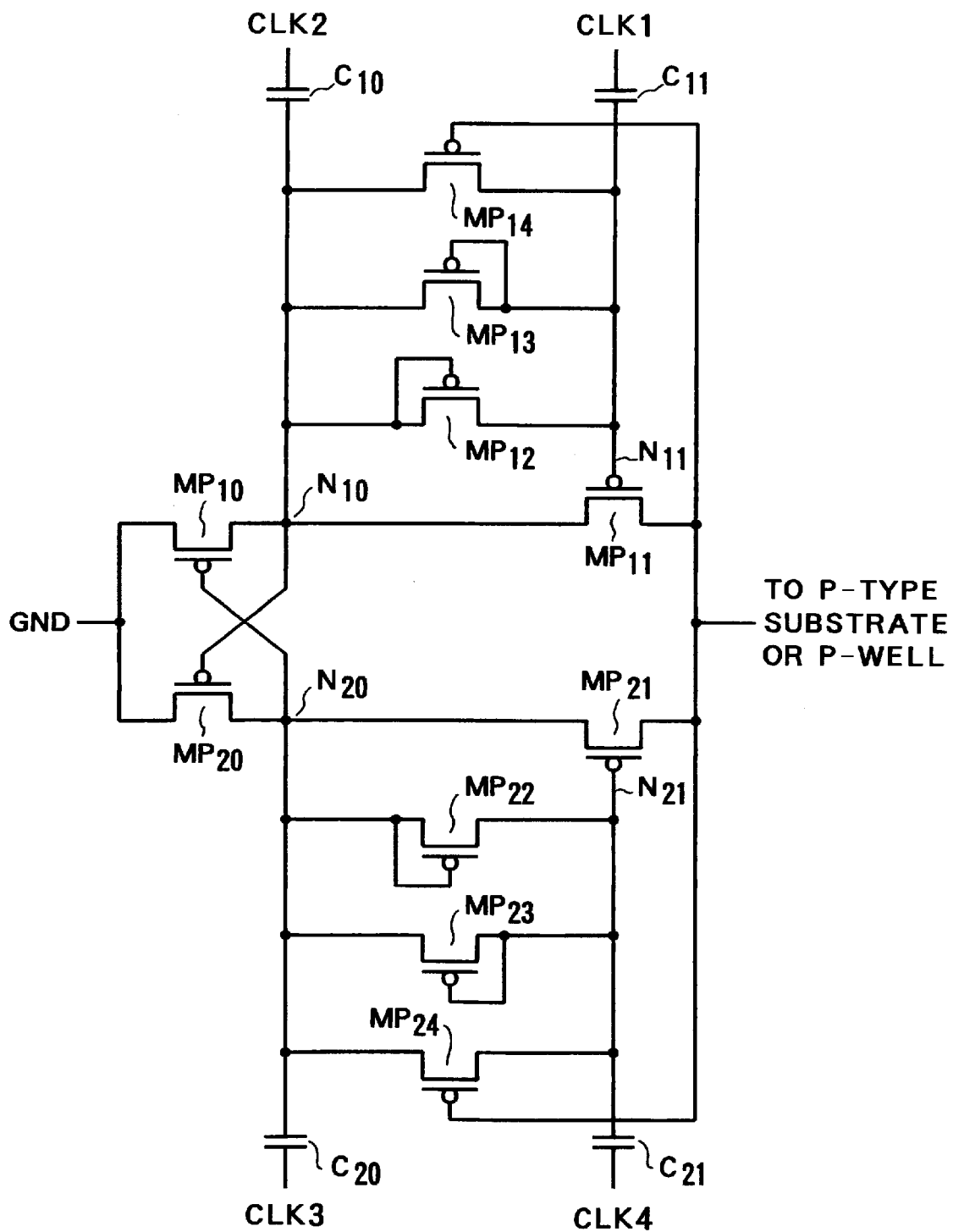
FIG. 11 is a circuit diagram showing the configuration of a first more practical example of charge pump element used in this invention.

In the case where the charge pump circuit $20_i$ (i=1, ... n) is used for the P-type substrate or the P-well, the charge pump element is composed, as shown in FIG. 11, for example, of 10 P-channel MOS transistors $MP_{10}$, $MP_{11}$, $MP_{12}$, $MP_{13}$, $MP_{14}$, $MP_{20}$, $MP_{21}$, $MP_{22}$, $MP_{23}$, $MP_{24}$, and four capacitors $C_{10}$, $C_{11}$, $C_{20}$, $C_{21}$.

The transistor $MP_{10}$ and the transistor $MP_{11}$ are connected in series, and the transistor $MP_{20}$ and the transistor $MP_{21}$ are connected in series. Drain of the transistor $MP_{10}$ and drain of the transistor $MP_{20}$ are commonly connected and are connected to ground power supply GND side. Moreover, gate of the transistor $MP_{10}$ is connected to source $N_{20}$ of the transistor $MP_{20}$, and gate of the transistor $MP_{20}$ is connected to source $N_{10}$ of the transistor $MP_{10}$.

Further, transistors $MP_{12}$, $MP_{13}$, $MP_{14}$ are connected in parallel between the source $N_{10}$ of the transistor $MP_{10}$ and gate $N_{11}$ of the transistor $MP_{11}$. In this example, gate of the transistor $MP_{12}$ is connected to source $N_{10}$ of the transistor $MP_{10}$, gate of the transistor $MP_{13}$ is connected to gate $N_{11}$ of the transistor $MP_{11}$, and gate of the transistor $MP_{14}$ is connected to source of the transistor $MP_{11}$. Similarly, transistors $MP_{22}$, $MP_{23}$, $MP_{24}$ are connected in parallel between source $N_{20}$ of the transistor $MP_{20}$ and gate $N_{21}$ of the transistor $MP_{21}$. Further, gate of the transistor $MP_{22}$ is connected to source $N_{20}$ of the transistor $MP_{20}$, gate of the transistor $MP_{23}$ is connected to gate $N_{21}$ of the transistor $MP_{21}$, and gate of the transistor $MP_{24}$ is connected to source of the transistor $MP_{21}$.

In this example, source of the transistor $MP_{11}$ and source of the transistor $MP_{21}$ are commonly connected and are connected to the P-type substrate or the P-well side.

On the other hand, one end of the capacitor $C_{10}$ is connected to source $N_{10}$ of the transistor $MP_{10}$, and clock signal CLK2 is applied to the other end. One end of the capacitor $C_{11}$ is connected to gate $N_{11}$ of the transistor $MP_{11}$ and clock signal CLK1 is applied to the other end.

Moreover, the capacitor $C_{20}$ has one end connected to source $N_{20}$ of the transistor $MP_{20}$ and the other end to which clock signal CLK3 is applied. The capacitor $C_{21}$ has one end connected to gate $N_{21}$ of the transistor $MP_{21}$ and the other end to which clock signal CLK4 is applied.

Figure 12:
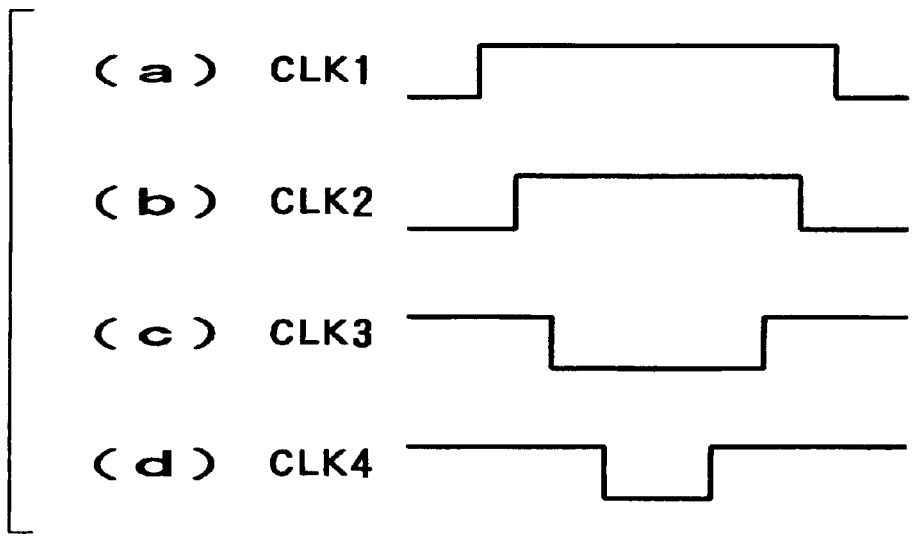
FIG. 12 is a waveform diagram of clock signal for driving the charge pump element shown in FIG. 11.

In this example, as shown in FIG. 12, clock signals CLK1, CLK2 are positive pulse, and clock signals CLK3, CLK4 are negative pulse. Further, ON time period (time period of "H" level) of the clock signal CLK2 is included in the ON time period of the clock signal CLK1. Moreover, ON time period (time period of "L" level) of the clock signal CLK3 is included in the ON time period of clock CLK2. In addition, ON time period of the clock signal CLK4 is included in the ON time period of the clock signal CLK3.

The operation of the charge pump element shown in FIG. 11 will now be described.

When clock signal CLK1 rises, potential of gate $N_{11}$ of the transistor $MP_{11}$ rises by capacitive coupling of the capacitor $C_{11}$. As a result, gate-source voltage $V_{GS}$ of the transistor $MP_{11}$ is decreased. For this reason, the transistor $MP_{11}$ is turned OFF.

When clock signal CLK2 rises in such a state, potential of source $N_{10}$ of the transistor $MP_{10}$ rises by capacitive coupling of the capacitor $C_{10}$. As a result, the gate-source voltage $V_{GS}$ of the transistor $MP_{10}$ is increased. For this reason, the transistor $MP_{10}$ is turned ON. Thus, electrical charges which have been stored in the capacitor $C_{10}$ begin being discharged to ground power supply terminal GND.

When clock signal CLK3 falls in such a state, potential of source $N_{20}$ of the transistor $MP_{20}$, i.e., gate of the transistor $MP_{10}$ is lowered by capacitive coupling of the capacitor $C_{20}$. For this reason, the gate-source voltage $V_{GS}$ of the transistor $MP_{10}$ is increased so that this transistor is placed in strong ON state. As a result, the electrical charges which have been stored in the capacitor $C_{10}$ are completely discharged to ground power supply GND. Thus, potential of the node $N_{10}$ becomes equal to ground potential.

When clock signal CLK3 rises in such a state, potential of the node $N_{20}$ rises by capacitive coupling of the capacitor $C_{20}$. Thus, $V_{GS}$ of the transistor $MP_{11}$ is decreased so that the transistor $MP_{11}$ is turned OFF.

When clock signal CLK2 further falls in such a state, potential of node $N_{10}$ connected to the drain of the transistor $MP_{11}$ is lowered by capacitive coupling of the capacitor $C_{10}$.

When clock signal CLK1 further falls in such a state, gate potential of the transistor $MP_{11}$ is lowered by the capacitive coupling of the capacitor $C_{11}$. For this reason, the gate-source voltage $V_{GS}$ of the transistor $MP_{11}$ is increased so that this transistor is placed in strong ON state to transfer electrical charges of the P-type substrate or the P-well to the capacitor $C_{10}$ until potentials of source and drain of the transistor $MP_{11}$ are balanced.

By repeating the above-mentioned operation, electrical charges of the P-substrate or P-well are sent out in succession to ground power supply terminal GND. While the operation which has been described until now has been the operation of the upper half (transistors $MP_{10}$, $MP_{11}$, etc.) of the charge pump element, this operation similarly applies also to the operation of the lower half (transistors $MP_{20}$, $MP_{21}$, etc.). In this case, clock signals related to the operation are clock signals CLK2, CLK3, CLK4.

In the case of such four-phase drive type charge pump elements shown in FIG. 11, since the transistors $MP_{10}$, $MP_{11}$, $MP_{20}$, $MP_{21}$ are placed in strong ON state, transfer quantity of electrical charges at one charge/discharge operation of the capacitor is large and the efficiency is good as compared to the two-phase drive charge pump.

Returning to FIG. 10 for a second time, a fifth embodiment will be described. In this fifth embodiment, for each positive integer i from 1 to n, the charge pump circuit $20_i$ has a structure in which, e.g., i number of charge pump elements shown in FIG. 11 are connected in series in the case where they are used for the P-type substrate or the P-well. In this case, the charge pump circuit $20_i$ has a structure in which terminal connected to the P-type substrate or the P-well side of the k-th ($1 \leq k \leq i-1$) stage of charge pump element is connected to terminal of the ground power supply side of the (k+1)-th charge pump element, wherein the terminal of the ground power supply side of the first stage of the charge pump element is connected to the ground power supply terminal, and the terminal of the P-type substrate or the P-well side of the i-th stage of charge pump element is connected to the P-type substrate or the P-well.

Also in this embodiment, there is employed a configuration in which respective capacitor capacities of the charge pump circuit $2_i$ are small as compared to capacities of corresponding capacitors of the charge pump circuit $2_{i-1}$.

Thus, in accordance with the semiconductor integrated circuit device of the fifth embodiment, the chip area is permitted to be as small as possible without lowering the maximum arrival voltage.

Figure 14:
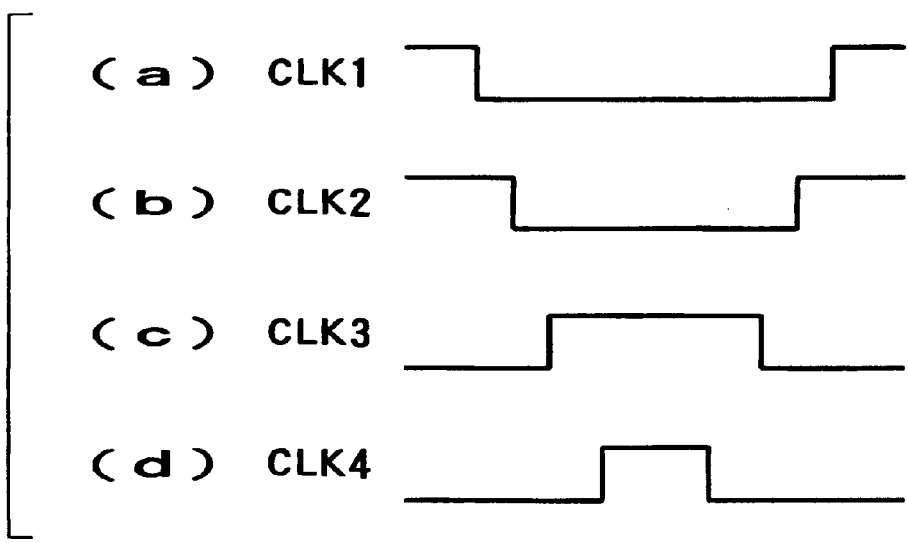
FIG. 14 is a waveform diagram of clock signal for driving the charge pump element shown in FIG. 13.
Figure 13:
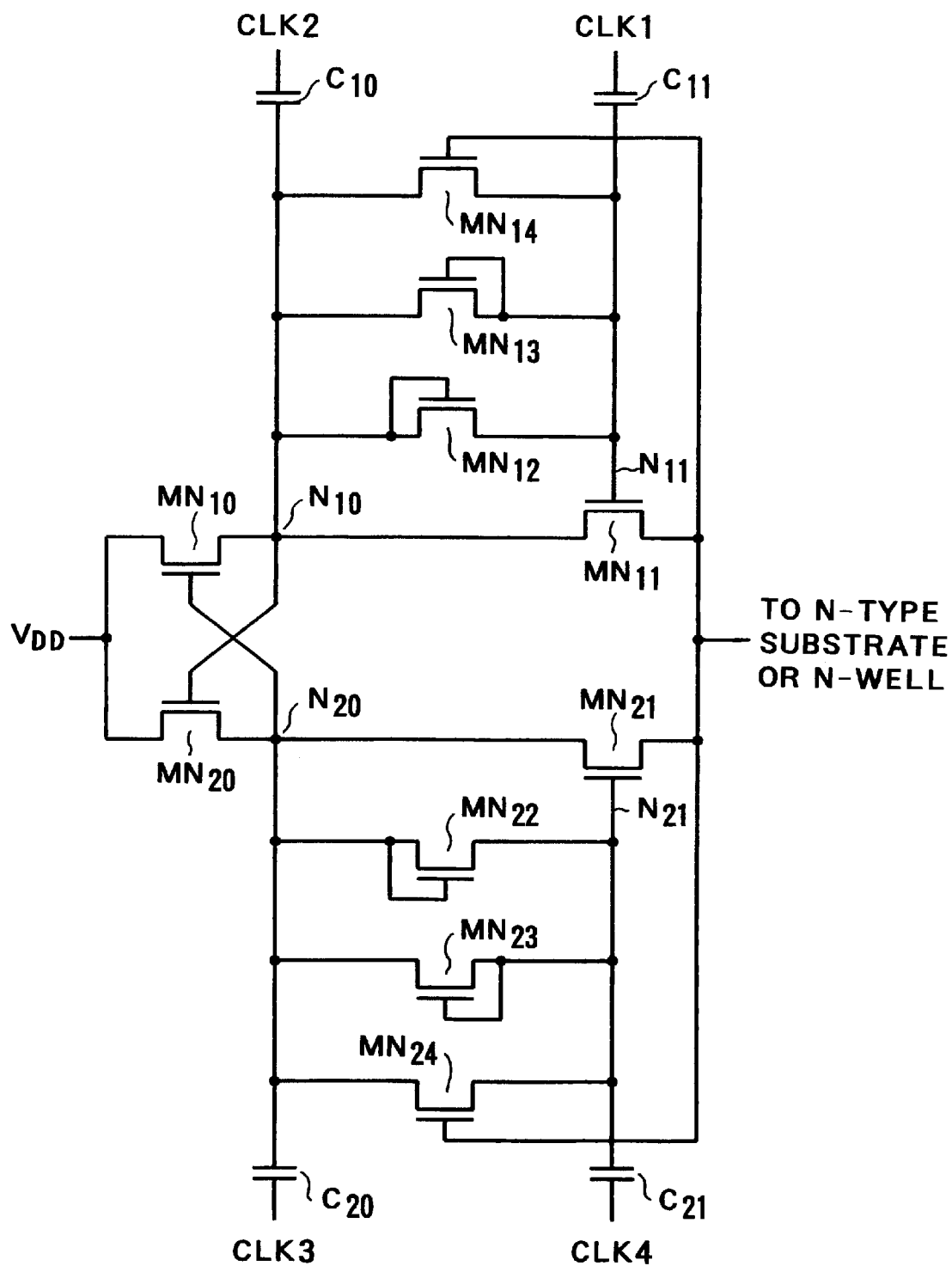
FIG. 13 is a circuit diagram showing the configuration of a second more practical example of the charge pump element.

It is to be noted that while the charge pump elements used for the P-type substrate or the P-well have been described in the fifth embodiment, charge pump elements shown in FIG. 13 are used in the case where they are used for the N-type substrate or the N-well. The charge pump elements shown in FIG. 13 are of a structure in which, in the charge pump elements shown in FIG. 11, P-channel MOS transistors are all replaced by N-channel MOS transistors, ground power supply GND is replaced by power supply $V_{DD}$, and P-type substrate or P-well is replaced by N-type substrate or N-well. Further, with respect to clock signals applied to the charge pump elements shown in FIG. 13, clock signals CLK1, CLK2 as shown in FIG. 14 are negative pulses and clock signals CLK3, CLK4 are positive pulse. With respect to respective ON time periods, similarly to the case shown in FIG. 12, ON time period (time period of "L" level) of clock signal CLK2 is included in the ON time period of the clock signal CLK1, ON time period (time period of "H" level) of the clock signal CLK3 is included in the ON time period of clock signal CLK2, and ON time period of clock signal CLK4 is included in the ON time period of clock signal CLK3.

Figure 15:
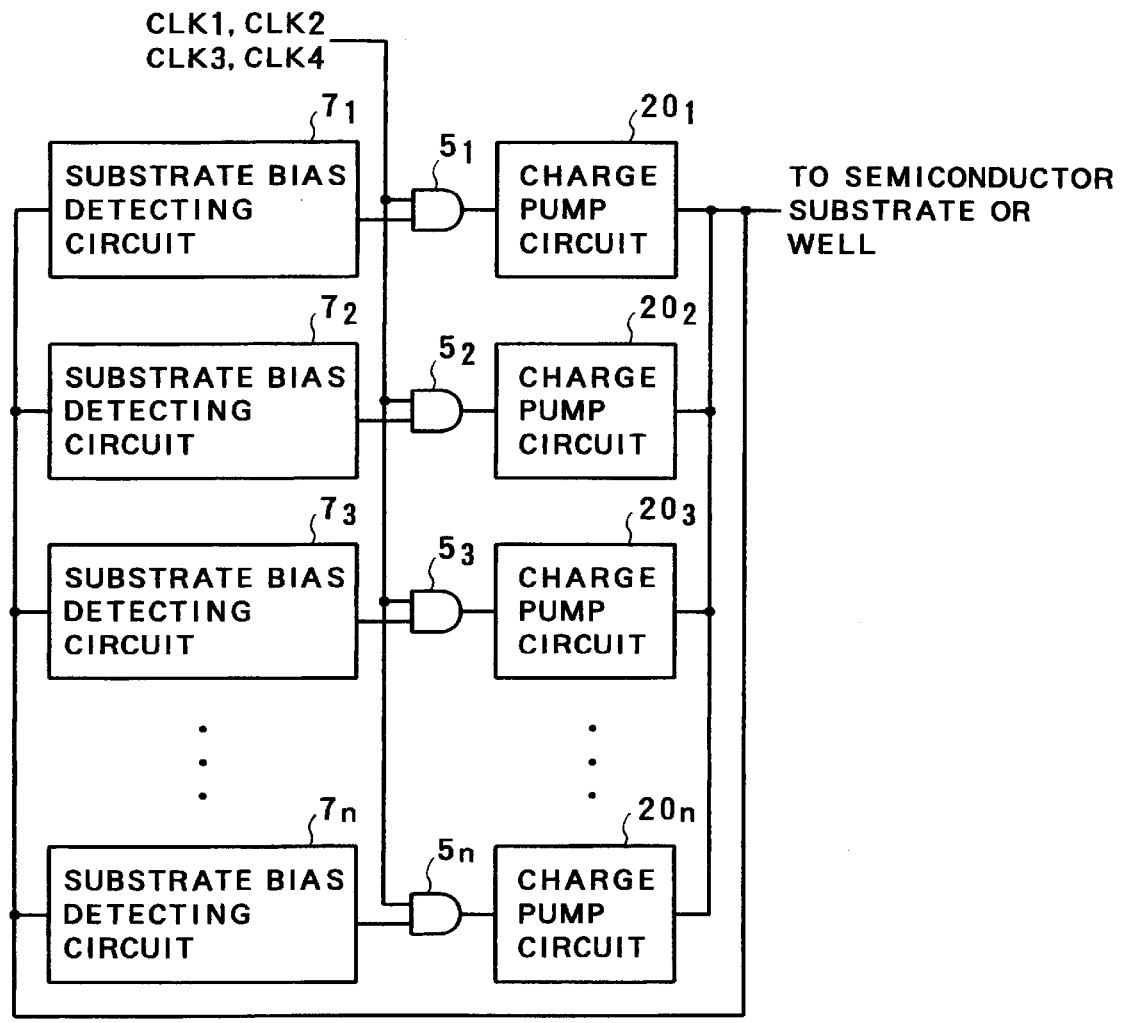
FIG. 15 is a block diagram showing the configuration of a sixth embodiment of this invention.

The configuration of a sixth embodiment of the semiconductor integrated circuit device according to this invention is shown in FIG. 15. This semiconductor integrated circuit device of the sixth embodiment has a structure in which, in the semiconductor integrated circuit device of the second embodiment shown in FIG. 3, for each positive integer i from 1 to n two-phase drive type charge pump circuit $2_i$ is replaced by four-phase drive type charge pump circuit $20_i$. At this time, each control gate $5_i$ is supplied with four-phase clock pulses CLK1, CLK2, CLK3, CLK4.

Moreover, each charge pump circuit $20_i$ has a configuration in which i number of charge pump elements are connected in series similarly to the fifth embodiment. Capacities of capacitors of each charge pump circuit $20_i$ are set so that they are smaller than capacities of corresponding capacitors of the charge pump circuit $20_{i-1}$.

Also in this sixth embodiment, the chip area is permitted to be as small as possible without lowering the maximum arrival voltage.

As described above, in accordance with this invention, the chip area is permitted to be as small as possible without lowering the maximum arrival voltage.

I claim:

1. A semiconductor integrated circuit device including first to n-th charge pump circuits respectively driven on the basis of clock to bias a semiconductor substrate or a well formed at the semiconductor substrate, wherein for each positive integer i from 1 to n−1, the i-th charge pump circuit is caused to have a structure in which it has large current drivability, but lower maximum arrival voltage as compared to the (i+1)-th charge pump circuit.

2. A semiconductor integrated circuit device as set forth in claim 1, wherein, with respect to each i-th (i=1, . . . n) charge pump circuit, there are provided
      a substrate bias detecting circuit for detecting substrate bias of the semiconductor substrate or the well to output a control signal when this detection value reaches the maximum arrival voltage of each of the i-th charge pump circuits, and pump control means for stopping supply of the clock to the i-th charge pump circuit on the basis of the control signal.

3. A semiconductor integrated circuit device as set forth in claim 1,
each i-th (i=1, . . . n) charge pump circuit comprising:
a series circuit in which plural P-channel MOS transistors each having gate and drain connected to each other are connected in series; and
plural capacitors provided with respect to respective ones of the plural MOS transistors of the series circuit except for the MOS transistor of the end of the series circuit having drain connected to a first power supply, and having respective one ends connected to gate of each of the MOS transistors and respective the other ends to which the clock is applied,
wherein the number of stages of the MOS transistors connected in series of the i-th (i=2, . . . n) charge pump circuit is larger than the number of stages of MOS transistors connected in series of the (i−1)-th charge pump circuit, and capacities of the respective capacitors of the i-th charge pump circuit are smaller than capacities of respective capacitors of the (i−1)-th charge pump circuit.

4. A semiconductor integrated circuit device as set forth in claim 1,
each i-th (i=1, . . . n) charge pump circuit comprising:
a series circuit in which plural N-channel MOS transistors having gate and drain connected to each other are connected in series; and
plural capacitors provided with respect to respective ones of the plural MOS transistors of the series circuit except for the MOS transistor of the end of the series circuit having drain connected to a first power supply, and having respective one ends connected to gate of each of the MOS transistors and respective the other end to which the clock is applied,
wherein the number of stages of the MOS transistors connected in series of the i-th (i=2, . . . n) charge pump circuit is larger than the number of stages of MOS transistors connected in series of the (i−1)-th charge pump circuit, and capacities of respective capacitors of the i-th charge pump circuit are smaller than capacities of the respective capacitors of the (i−1)-th charge pump circuit.

5. A semiconductor integrate circuit device as set forth in claim 1,
wherein the clock is two-phase clock signals which are the same in frequency, but are different in phase.

6. A smeiconductor integrated circuit device as set forth in claim 1,
wherein each i-th charge pump circuit has a structure in which i number of charge pump elements driven by four-phase clock pulses are connected in series.

7. A semiconductor integrated circuit device as set forth in claim 6,
wherein the four-phase clock pulses consist of first to fourth clock pulses, wherein ON time period of the second clock pulse is included in ON time period of the first clock pulse, ON time period of the third clock pulse is included in ON time period of the second clock pulse, and ON time period of the fourth clock pulse is included in ON time period of the third clock pulse.

8. A semiconductor integrated circuit device as set forth in claim 2,
each i-th (i=1, . . . n) charge pump circuit comprising:
a series circuit in which plural P-channel MOS transistors having gate and drain connected to each other are connected in series; and
plural capacitors provided with respect to respective ones of the plural MOS transistors of the series circuit except for the MOS transistor of the end of the series circuit having drain connected to a first power supply, and having respective one ends connected to gate of each of the MOS transistors and respective the other ends to which the clock is applied,
wherein the number of stages of the MOS transistors connected in series of the i-th (i=2, . . . n) charge pump circuit is greater than the number of the MOS transistors connected in series of the (i−1)-th charge pump circuit, and capacities of the respective capacitors of the i-th charge pump circuit are smaller than capacities of the respective capacitors of the (i−1)-th charge pump circuit.

9. A semiconductor integrated circuit device as set forth in claim 2,
each i-th (i=1, . . . n) charge pump circuit comprising:
a series circuit in which plural N-channel MOS transistors having gate and drain connected to each other are connected in series;
plural capacitors provided with respect to respective ones of the plural MOS transistors of the series circuit except for the MOS transistor of the end of the series circuit having drain connected to a first power supply, and having respective one ends connected to the gates of the respective MOS transistors and respective the other ends to which the clock is applied,
wherein the number of stages of MOS transistors connected in series of the i-th (i=2, . . . n) charge pump circuit is larger than the number of stages of the MOS transistors of the (i−1)-th charge pump circuit, and capacities of the respective capacitors of the i-th charge pump circuit are smaller than capacities of respective capacitors of the (i−1)-th charge pump circuit.

10. A semiconductor integrated circuit device as set forth in claim 2,
wherein the clock is two-phase clock signals which are the same in frequency, but are different in phase.

11. A semiconductor integrated circuit device as set forth in claim 2,
wherein each i-th charge pump circuit has a configuration in which i number of charge pump elements driven by four-phase clock pulses are connected in series.

12. A semiconductor integrated circuit device as set forth in claim 11,
wherein four-phase clock pulse signals consist of first to fourth clock pulses, wherein ON time period of the second clock pulse is included in ON time period of the first clock pulse, ON time period of the third clock pulse is included in ON time period of the second clock pulse, and ON time period of the fourth clock pulse is included in the ON time period of the third clock pulse.

13. A semiconductor integrated circuit device as set forth in claim 3,
wherein the clock is two-phase clock signals which are the same in frequency, but are different in phase.

* * * * *